(12) United States Patent
Sekihara

(10) Patent No.: US 7,362,417 B2
(45) Date of Patent: Apr. 22, 2008

(54) PELLICLE FRAME AND PELLICLE FOR PHOTOLITHOGRAPHY USING THE SAME

(75) Inventor: Kazutoshi Sekihara, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 63 days.

(21) Appl. No.: 11/196,438

(22) Filed: Aug. 4, 2005

(65) Prior Publication Data

US 2006/0038974 A1    Feb. 23, 2006

(30) Foreign Application Priority Data

Aug. 18, 2004   (JP)   ............... 2004-238470

(51) Int. Cl.
*G03B 27/62* (2006.01)
*G03F 1/00* (2006.01)

(52) U.S. Cl. ............................. 355/75; 430/5

(58) Field of Classification Search .......... 355/53, 355/75; 430/5; 428/14
See application file for complete search history.

(56) References Cited

U.S. PATENT DOCUMENTS 5,042,655 A * 8/1991 Beldyk et al. ........... 206/316.1
6,103,427 A * 8/2000 Storm ......................... 430/5

FOREIGN PATENT DOCUMENTS

| JP | 2001-42507 | * | 2/2001 |
| JP | 2001-343737 | * | 12/2001 |
| JP | 2002-333703 | * | 11/2002 |

* cited by examiner

*Primary Examiner*—Alan Mathews
(74) *Attorney, Agent, or Firm*—Lowe Hauptman Ham & Berner, LLP

(57) ABSTRACT

A frame that prevents the decrease in the exposure area by preventing the frame from curving inward by the tensile force of the pellicle membrane and makes it possible to obtain a pellicle having excellent dimensional accuracy and attachment position accuracy on a photomask, and a pellicle for photolithography using the frame. A pellicle frame of the present invention comprises, in at least one pair of opposite side members of a generally rectangular frame body, a portion with an arc form curved outward in the center portion of the side members, portions with an arc form curved inward on both sides of the portion curved outward, and portions with a straightly linear form on the outer sides of the portions curved inward. The radius of the portions with an arc form curved inward is preferably ⅓ or larger of the radius of the portion with an arc form curved outward.

5 Claims, 3 Drawing Sheets

F I G. 1
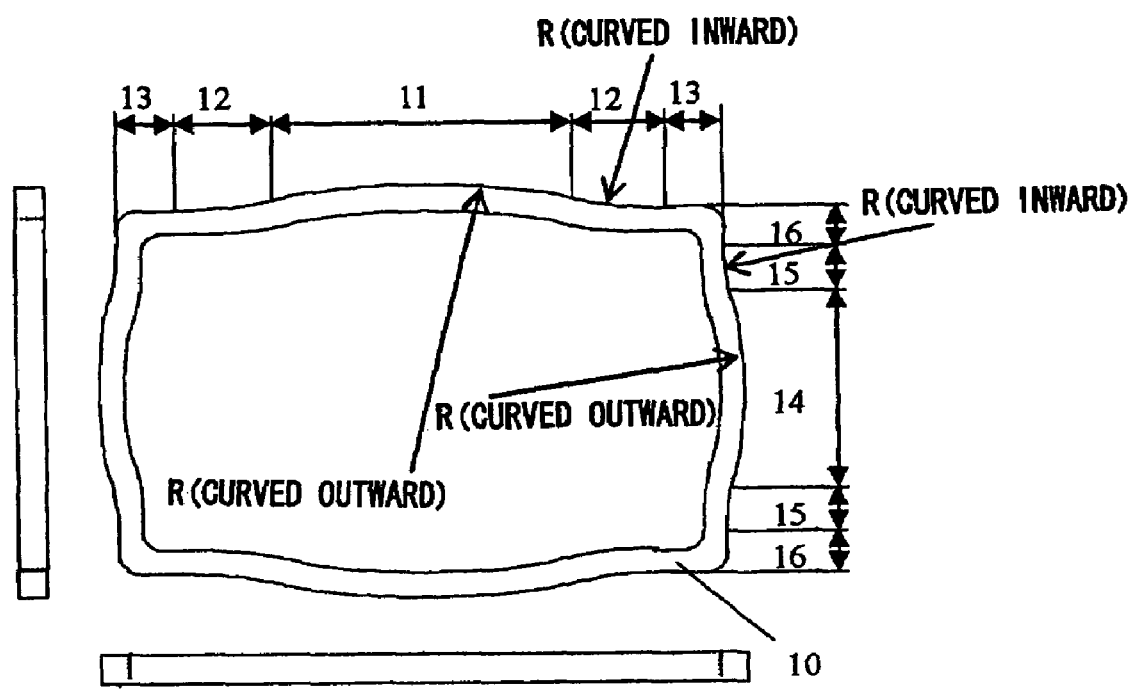
F I G. 2
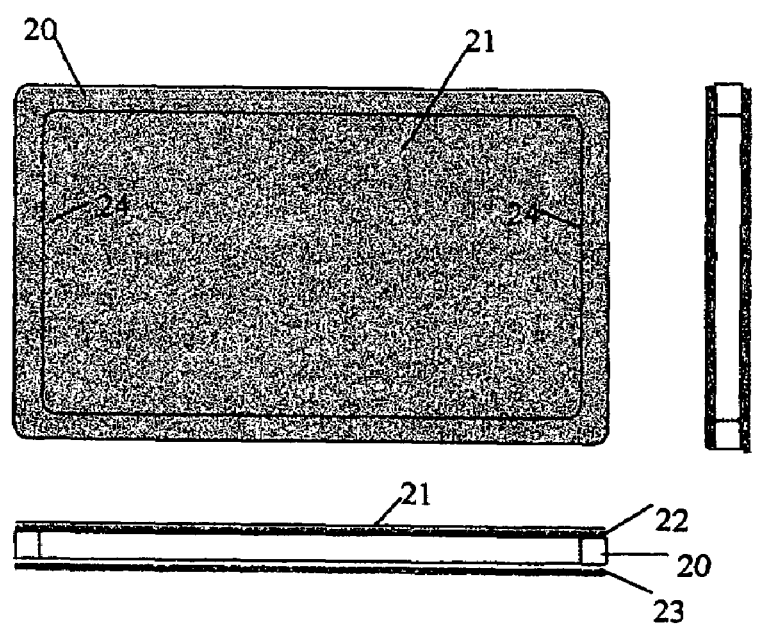

PELLICLE FRAME AND PELLICLE FOR PHOTOLITHOGRAPHY USING THE SAME

BACKGROUND OF THE INVENTION

1. Field of the Invention

The present invention relates to a pellicle for photolithography that can be used for preventing dust deposition in the manufacture of semiconductor devices, printed circuit boards, or liquid-crystal displays.

2. Description of the Related Art

In the manufacture of semiconductor devices such as LSIs or liquid-crystal displays, patterns are produced by irradiating a semiconductor wafer or a glass substrate for liquid crystals with light, but if dust particles deposit onto the photomasks or reticles (both are referred to hereinbelow simply as "photomasks") that are used in this process, the dust particles will shield or deflect the light, thereby destroying the transferred pattern.

For this reason, the operations of producing a pattern are usually conducted in a clean room, but even there the photomasks are difficult to maintain in a clean state all the time. For this reason, a method of mounting a pellicle is undertaken for preventing dust from deposition onto the photomask surface.

In this case, foreign matter deposits on the pellicle, rather than depositing directly onto the photomask surface. Therefore, if the exposure light is focused to the photomask pattern during the photolithography, the foreign matter present on the pellicle membrane does not affect the light transmission.

A pellicle is usually fabricated by placing a transparent pellicle membrane composed of nitrocellulose, cellulose acetate, or a fluorocarbon resin with good light transmissivity on the upper end surface of a pellicle frame (referred to hereinbelow simply as "frame") made of aluminum, stainless steel or polyethylene, applying a solvent, and bonding by blowing dry air (see Japanese Patent Application Laid-open No. 58-219023) or by bonding with an adhesive such as an acrylic resin or epoxy resin (see U.S. Pat. No. 4,861,402 or Japanese Examined patent Application No. 63-27707). Furthermore, a pressure-sensitive adhesive layer comprising a polybutene resin, polyvinyl acetate resin, or acrylic resin for attaching to a photomask and a separation layer (separator) for protecting the pressure-sensitive adhesive layer are provided on the lower end surface of the frame.

In order to avoid the difference in pressure between the inside space of a pellicle surrounded by the pellicle membrane bonded to the frame and the outside when the pellicle is attached to the photomask, a small air-escape opening for balancing the gas pressure is sometimes provided in a part of the frame and a filter is disposed on the small opening to prevent the intrusion of foreign matter from the air moving through the small opening (Japanese Examined Utility Model Application No. 63-39703).

The pellicle membrane is usually formed from a very thin resin film. Therefore, in order to attach the film to the frame, in a slack-free fashion, it has to be bonded to the frame in a state in which an adequate tensile force is uniformly applied in all the directions.

For this reason, with rectangular pellicles, which are usually used, a certain inward curving can be observed in the frame after the pellicle membrane has been bonded thereto due to the tension of the membrane. This phenomenon becomes significant when the frame has a large dimension, for example, as in the case of large pellicles used for the manufacture of printed circuit boards or liquid-crystal displays.

On the other hand, in order to reduce cost, the photomasks are required to ensure a large exposure area. The resultant problem is that, unless the inward curving of the frame is minimized, the exposure area (surface area) that can be used decreases accordingly. This problem obviously can be resolved by increasing the frame rigidity, for example, by increasing the cross-sectional area of the frame, but the above-described problem of exposure area is associated with the inside of the frame and a clearance for handling, which is required when the photomask is fixed or transported, has to be ensured on the outside of the frame. For this reason, a limitation is placed on the size of the cross-sectional area of the frame. Accordingly, each side of the frame is usually formed to have a straightly linear form determined by those limitations.

An attempt was made to resolve this problem, for example, with a method of obtaining an almost straightly linear form by using a tensile force of a membrane to curve the longer sides of a frame that were caused to bulge outward in advance (see Japanese Patent Application Laid-open No. 2001-42507).

The advantage of this method is that the fabrication can be easily conducted due to a relatively simple worked form and the desired exposure areas also can be ensured, but a problem is associated with dimensional accuracy. For example, as shown in FIG. 4A, when a longer side 41 of the frame is curved outward, if a pellicle membrane is attached to the frame, then the shape shown in FIG. 4B is assumed, curved zones remain in the portions 44 close to the corners, and the entire area surrounded by the frame cannot be used as the exposure area. Thus, the area that can be used as the exposure area is the shadowed portion 43 surrounded by straight lines.

The curved portions remaining close to the corners of the frame are caused due to the fact that a tensile force of the pellicle membrane and the curved form of the bulged frame are not properly balanced. Another problem associated with this method is that the pellicle is difficult to align when attaching to the photomask and positioning accuracy of the attached pellicle on the photomask decreases due to deformation of the outer form of the frame.

Furthermore, because no reference position is appropriately set for the curved side that bulged to the outside of the frame, accurate size measurements after processing are difficult to be conducted. The resultant problem is that accuracy control during frame manufacture is difficult and processing accuracy can easily be decreased.

With such a measure involving curving of the frame, if the side length is increased, the shorter side also has to be curved, but if a curved form is produced on the shorter side in addition to the longer side, there is absolutely no section that should serve as a reference in size measurements and accurate size measurements after processing are difficult to be conducted. As a result, dimensional accuracy decreases even more significantly.

SUMMARY OF THE INVENTION

It is an object of the present invention to provide a frame that allows prevention of a decrease in the exposure area and prevention of the inward curving of the frame by the tensile force of the pellicle membrane and makes it possible to obtain a pellicle having excellent dimensional accuracy and attachment position accuracy on a photomask and also to produce a pellicle for photolithography using such a frame.

The present invention was created to resolve the above-described problems, and the frame, in accordance with the present invention comprises, in at least one pair of opposite side members of a frame body, a portion with an arc form curved outward in the center portion of the side member, portions with an arc form curved inward on both sides of the portion curved outward, and portions with a straightly linear form on each of the outer sides of the portions curved inward. It is preferred that the radius of curvature of the portions with an arc form curved inward is ⅓ or larger of the radius of curvature of the portion with an arc form curved outward.

In the frame in accordance with the present invention the size and range of the portions with an arc form and the portions with a straightly linear form are designed so that, when a pellicle is constituted by bonding a pellicle membrane to the pellicle frame, each side member of the pellicle frame becomes straightly linear under the effect of the tensile force of the bonded pellicle membrane.

The present invention is especially effective when at least one pair of the opposite side members of the frame body has a length of 400 mm or larger.

A pellicle for photolithography with high dimensional accuracy can be obtained by bonding a pellicle membrane to the pellicle frame of the above-described form.

In accordance with the present invention, inward curving of the frame members by the tensile force of the pellicle membrane is prevented, decrease in the area available for exposure is prevented, and a pellicle with very good dimensional accuracy and excellent bonding position accuracy on the photomask can be obtained.

Furthermore, because the straightly linear portions are present close to the corner portions of the side members, an accurate positional reference can be taken and the size measurements can be carried out with good accuracy. Therefore, the frame processing accuracy itself can be increased. As a result, the dimensional accuracy of the pellicle can be further improved.

BRIEF DESCRIPTION OF THE DRAWINGS

FIG. 1 is a schematic drawing illustrating an example of the frame in accordance with the present invention;

FIG. 2 is a schematic drawing illustrating an example of the pellicle fabricated by using the frame in accordance with the present invention;

DESCRIPTION OF THE PREFERRED EMBODIMENTS

Circular or angular smooth substrates with a perimeter larger than the frame are typically used for forming a pellicle membrane, but in the case of producing a pellicle large enough to cause the frame curving problem, an angular substrate for forming the membrane is mainly used to reduce the substrate processing cost.

Figure 5:
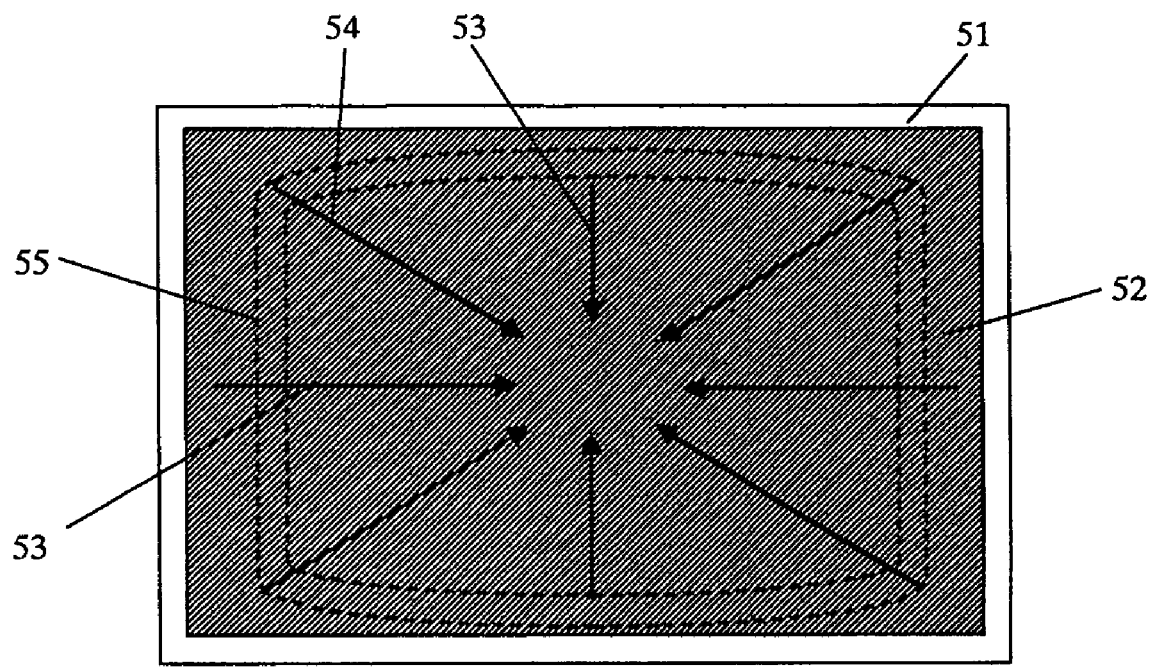
FIG. 5 shows the directions of tensile forces in the case where the pellicle membrane is tensioned and held with a peeling jig.

When an angular substrate is used to form a pellicle membrane, a pellicle membrane formed on the substrate, for example, by a spin coating method is peeled with a frame-like peeling jig 51 as shown in FIG. 5 and held by deposition. In this case, when a pellicle membrane 52 is attached to a frame 55, a tensile force 53 acting in the direction perpendicular to the side curves the center portion of each side of the frame 55.

However, the tensile forces 54 in the diagonal directions act in the directions of pushing the frame from the corners to the center, but due to the rigidity of the frame corners, the components in the direction to cause curving of the frame become smaller. Moreover, because the forces in the respective directions balance with the others, the frame curving amount in the vicinity of the corners becomes very small.

Therefore, in order to obtain a pellicle with good shape accuracy, the frame shape has to be determined by taking those issues into account. The inventors have discovered this phenomenon and completed the present invention based on the results of their comprehensive study.

Thus, the frame in accordance with the present invention that resolves the above-described problems comprises in at least one pair of opposite side members of a frame body, a portion with an arc form curved outward in the center portion of the side members, portions with an arc form curved inward on both sides of the portion curved outward, and portions with a straightly linear form on the outer sides of the portions curved inward. As a result, the frame is prevented from being curved inward under the effect of the tensile force of the pellicle membrane and the decrease in the exposure area is prevented.

Furthermore, when the radius of curvature of the portions with an arc form curved inward is ⅓ or larger of the radius of curvature of the portion with an arc form curved outward, the portions with a shape curved inward and the portion with a shape curved outward can be connected continuously and smoothly to each other. Furthermore, it is important that the size and range of the portions with an arc form and portions with a straightly linear form be so designed in advance that each side of the pellicle frame becomes straightly linear under the effect of the tensile force in the bonded pellicle membrane.

Because the frame in accordance with the present invention has the above-described form, an appropriate balance with the tensile force of the pellicle membrane can be attained not only in the center portion of the frame, but also in the vicinity of the corner portions. Therefore, a pellicle with very good dimensional accuracy and linearity of side members can be obtained. Furthermore, because the linear portions are located in the vicinity of the corner portions, a positional reference can be accurately taken when the dimensions are measured after the processing and the frame processing accuracy can be increased. As a result, no displacement occurs even when the pellicle is attached to the photomask and the attachment position accuracy of the pellicle is increased.

Furthermore, because the straightly linear portions are located in the vicinity of the corner portions, not only a positional reference can be accurately taken when the dimensions are measured after the processing and the frame processing accuracy is increased, but for the same reasons this form can be provided on each of the longer and on the shorter sides.

If a pellicle is constructed by using such a pellicle frame, a pellicle with an excellent dimensional accuracy can be obtained.

The form of the frame in accordance with the present invention is applicable to frames of any size, but it is especially effective when applied to large pellicle frames with at least one pair of opposite sides has a length of 400 mm or longer.

DESCRIPTION OF THE PREFERRED EMBODIMENTS

Preferred embodiments of the present invention will be described below, but the present invention is not limited thereto.

FIG. 1 illustrates an embodiment of the present invention. This is an example of employing the present invention in a rectangular frame. In this frame, the center portion of a longer side is a portion 11 with an arc form curved outward (outward convex), this portion being symmetrical with respect to the center line, portions 12, 12 with an arc form curved inward (inward convex) are disposed on both sides of the portion curved outward, and portions 13, 13 with a straightly linear form are disposed from the outer sides of the portions curved inward to the corner portions. Similarly, on the shorter side, the center portion is a portion 14 with an arc form curved outward, this portion being symmetrical with respect to the center line, portions 15, 15 with an arc form curved inward are disposed on both sides of the portion curved outward, and portions 16, 16 with a straightly linear form are disposed from the outer sides of the portions curved inward to the corner portions.

In this case, the size of the arcs of the portion with an arc form curved outward and portions with an arc form curved inward in the frame and the distribution of ranges of those portions with an arc form and portions with a straightly linear form have to be appropriately designed according to the combination of the frame shape and substrate for forming a membrane (peeling jig) so that each side member becomes a straightly linear form when the pellicle membrane is bonded to the frame and trimmed.

It is especially preferred that the radius of curvature of the portions with an arc form curved inward be ⅓ or larger of the radius of curvature of the portion with an arc form curved outward, because a smooth transition can be attained from the outward convex to the inward convex.

An example of the rectangular pellicle thus designed and fabricated is shown in FIG. 2. In the present embodiment, the frame width is the same on all the sides and the portions on the inside of the frame are formed to match the portions on the outside of the frame, but the width is not required to be uniform throughout and may be changed, if necessary. For example, a rigidity may be adjusted by slightly changing the frame width, and a more accurate balance with the tensile force of the membrane can be attained.

Furthermore, in this embodiment, each side member of the frame is formed of arcs and straight lines, but it goes without saying that the portions with an arc form can be formed of a plurality of short portions with a straightly linear form and the entire side be composed of a portion with an arc form curved outward, portions with an arc form curved inward, and portions with a straightly linear form, and this embodiment is also included in the scope of the present invention.

The process of forming a frame side from portions with an arc form and portions with a straightly linear form can be implemented on the sides where the frame might be curved by the tensile force of the pellicle membrane. Thus, this process may be employed only on the longer sides or only on the shorter sides, rather than both on the shorter sides and the longer sides as in the above-described embodiment.

EXAMPLES

Example 1

Examples of the present invention will be described below, but the present invention is not limited thereto and various modifications thereof are possible.

A frame 10 of an aluminum alloy having the form shown in FIG. 1 was fabricated by machining. The frame 10 had a rectangular shape with a distance between the adjacent corners of 1136 mm by 783 mm on the outside and 1116 mm by 761 mm on the inside. Here, a portion 11 with an arc form curved outward and having a radius of curvature of 100353 mm, portions 12, 12 with an arc form curved inward and having a radius of curvature of 50000 mm, and portions 13, 13 with a straightly linear form disposed from the portions with an arc form curved inward to the corner portions were formed continuously on the longer sides of the frame 10. The apex position (that is, the center portion) of the portion 11 with an arc form curved outward protruded 1 mm to the outside beyond the corner portion.

A portion 14 with an arc form curved outward and having a radius of curvature of 63253 mm, portions 15, 15 with an arc form curved inward and having a radius of curvature of 50000 mm, and portions 16, 16 with a straightly linear form disposed from the portions with an arc form curved inward to the corner portions were formed continuously on the shorter sides of the frame 10. The apex position (that is, the center portion) of the portion 14 with an arc form curved outward protruded 0.5 mm to the outside beyond the corner portion.

The frame width was 11 mm on the longer sides and 10 mm on the shorter sides, and the inner side of the frame was formed to have the same shape as the outer side thereof. The frame height was 6 mm, and the corner portion in each corner was formed to have an R (radius of curvature) of 11 mm on the outer side and an R (radius of curvature) of 2 mm on the inner side.

The frame 10 thus obtained was washed and dried. Then, a pressure-sensitive silicone adhesive KR120 (trade name, manufactured by Shin-Etsu Chemical Co., Ltd.) was applied as a pellicle membrane adhesive layer 22 on one end surface and as a mask pressure-sensitive adhesive layer 23 on the other end surface and cured by heating.

Furthermore, a film of a fluorocarbon polymer Cytop (trade name, manufactured by Asahi Glass Co., Ltd.) was formed by spin coating on a rectangular quartz substrate with outer dimensions of 900 mm by 1250 mm and a thickness of 10 mm, it was then bonded to a frame of the same outer shape as the substrate and peeled off, a pellicle membrane with a thickness of about 4 μm was attached to the frame, and the unnecessary membrane located outside the frame was trimmed off with a cutter and removed to give a pellicle.

As for the shape of the completed pellicle, the outside and inside shape of the frame 10 having the portions with an arc form curved outward and the portions with an arc form curved inward became strictly straightly linear because the portions with an arc form curved outward and curved inward were curved by the tensile force of the pellicle membrane 21 as shown in FIG. 2.

The pellicle was placed on a cast iron scale and the frame shape was measured with a spacing of 50 mm by moving a holder with a dial gage (manufactured by Mitsutoyo Co.) attached thereto along a bar made from a metal (S45C). The contact surface of the bar serving as a reference for the dial gage was polished to a flatness and straightness of 0.03 mm or less. As a result, in all the measurement points on the inner side and outer side of four sides, the deviation from the corner portions was 0.05 mm or less.

Absolutely no unusual distorted shape or cutting edge notches were observed in the connection portions of the portions with an arc form curved outward, portions with an arc form curved inward, and portions with a straightly linear form and the external appearance was good.

Comparative Example 1

Figure 3A:
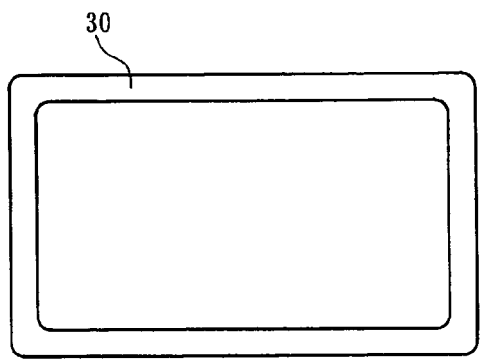
FIG. 3A shows the shape of a conventional frame.
Figure 3B:
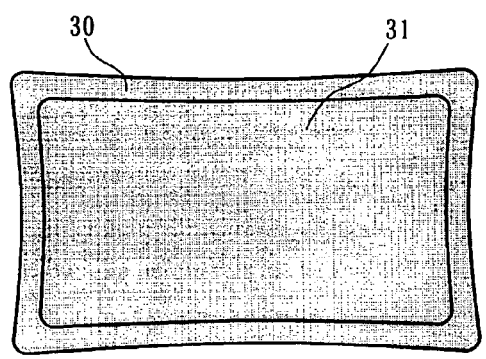
FIG. 3B is a schematic drawing showing the conventional pellicle obtained by bonding a pellicle membrane to the frame of FIG. 3A.

A pellicle frame 30 of an aluminum alloy having a typical shape with straightly liner sides shown in FIG. 3A was fabricated by machining. This frame 30 had a rectangular shape with an external distance between the corners of 1136 mm by 783 mm and an internal distance between the corners of 1116 mm by 761 mm. The frame height was 6 mm. Each corner portion was formed to have a smooth shape with an outer radius R of 11 mm and an inner radius R of 2 mm. A pellicle was fabricated by bonding a pellicle membrane 31 by the same process as in Example 1. The outer shape of this pellicle is shown in FIG. 3B.

This pellicle had a significant inward curving of about 1 mm in the center portion of the longer sides and about 0.5 mm in the center portion of the shorter sides. For this reason, the exposure area was reduced by about 1 mm in the longer side direction and by about 2 mm in the shorter side direction.

Figure 4A:
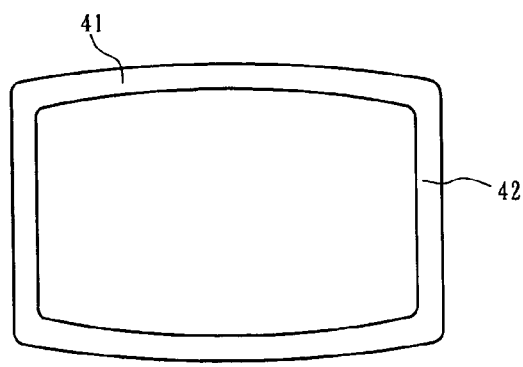
FIG. 4A shows the frame in which the longer sides are curved outward.

A pellicle frame in which longer sides 41 had a shape curved outward and shorter sides 42 had a straightly linear form, as shown in FIG. 4A, was fabricated by machining. The external distance between the corners was 1136 mm by 783 mm and the internal distance between the corners was 1116 mm by 761 mm, as in Comparative Example 1, but the longer sides had a shape in which ends of corners were connected by arcs curved outward and having a radius of curvature of 215083 mm. The frame width was 11 mm on the longer sides and 10 mm on the shorter sides, and the inner side of the frame was formed to have the same shape as the outer side thereof. The frame height was 6 mm, and the corner portion in each corner was formed to have an R of 11 mm on the outer side and an R of 2 mm on the inner side. A pellicle was fabricated by bonding a pellicle membrane 43 by the same process as in Example 1 and Comparative Example 1.

Figure 4B:
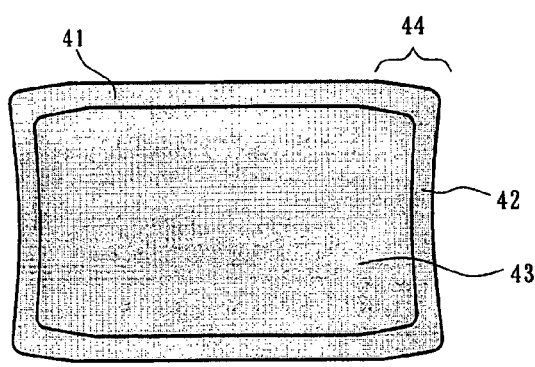
FIG. 4B is a schematic drawing showing a pellicle obtained by bonding a pellicle membrane to the frame of FIG. 4A.

The outer shape of the pellicle thus obtained is shown in FIG. 4B. Though the longer sides 41 of the pellicle had an almost straightly linear form, the convex shape curved outward remained over a zone with a length of about 120 mm in the vicinity 44 of the corner portions. Furthermore, an inward curving of about 0.5 mm appeared in the center portions of the shorter sides 42. For this reason, though the exposure area did not decrease in the shorter side direction, it was reduced by about 1 mm in the longer side direction. Furthermore, in the outer shape of the pellicle, a convex shape was formed on the longer sides and a concave shape was formed on the shorter sides. With such a shape, no reference position could be taken and alignment during pellicle attachment to the photomask was very difficult.

The pellicle in accordance with the present invention can be advantageously used for preventing dust deposition in the manufacture of semiconductor devices, printed circuit boards, or liquid-crystal displays.

What is claimed is:

1. A pellicle frame consisting of a generally rectangular frame comprising:
    a pellicle frame comprising a generally rectangular frame body including a pair of opposite side members each of which includes an interior wall and an exterior wall, and where both of said opposite side members have a curved contour along at least one of said walls; and
    said curved contour comprising a portion with an arc form curved outward in the center portion of said arc of said side member, portions defining an arc form curved inwardly with inner and outer sides on both sides of the portion curved outward and end portions with a straight line form on the outer sides of the portions curved inward.

2. The pellicle frame according to claim 1, wherein the radius of curvature of the portions with an arc form curved inward is no less than ⅓ of the radius of curvature of the portion with an arc form curved outward.

3. The pellicle frame according to claim 1, wherein the size and range of the portions with an arc form and portions with a straightly linear form are designed so that, when a pellicle is constituted by bonding a pellicle membrane to the pellicle frame, each side member of the pellicle frame becomes straightly linear under the effect of the tensile force of the bonded pellicle membrane.

4. frame according to claim 1, wherein the length of at least one pair of the opposite side members of the frame body is 400 mm or larger.

5. A framed pellicle for photolithography, which is obtained by bonding a pellicle membrane to the pellicle frame according to claim 1.

* * * * *